United States Patent
Obata

(10) Patent No.: US 10,777,707 B2
(45) Date of Patent: Sep. 15, 2020

(54) GROUP-III NITRIDE STACKED BODY AND GROUP-III NITRIDE LIGHT-EMITTING ELEMENT

(71) Applicant: Stanley Electric Co., Ltd., Tokyo (JP)

(72) Inventor: Toshiyuki Obata, Yamaguchi (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 16/096,705

(22) PCT Filed: Apr. 26, 2017

(86) PCT No.: PCT/JP2017/016578
§ 371 (c)(1),
(2) Date: Oct. 26, 2018

(87) PCT Pub. No.: WO2017/188324
PCT Pub. Date: Nov. 2, 2017

(65) Prior Publication Data
US 2019/0312178 A1 Oct. 10, 2019

(30) Foreign Application Priority Data
Apr. 27, 2016 (JP) .................. 2016-089487

(51) Int. Cl.
*H01L 33/32* (2010.01)
*C30B 29/40* (2006.01)
(Continued)

(52) U.S. Cl.
CPC .......... *H01L 33/325* (2013.01); *C30B 29/406* (2013.01); *H01L 33/0075* (2013.01); *H01L 33/06* (2013.01); *H01L 33/32* (2013.01)

(58) Field of Classification Search
CPC ..... H01L 33/06; H01L 33/0075; H01L 33/12; H01L 33/14; H01L 33/145; H01L 33/16; H01L 33/32; H01L 33/325
See application file for complete search history.

(56) References Cited

U.S. PATENT DOCUMENTS

2007/0101932 A1 5/2007 Schowalter et al.
2010/0219395 A1 9/2010 Hirayama et al.
(Continued)

FOREIGN PATENT DOCUMENTS

JP 2008160025 A 7/2008
JP 2017050439 A 3/2017
(Continued)

OTHER PUBLICATIONS

International Preliminary Report on Patentability, dated Nov. 8, 2018.
(Continued)

*Primary Examiner* — Sue A Purvis
*Assistant Examiner* — Scott Stowe
(74) *Attorney, Agent, or Firm* — Cahn & Samuels, LLP

(57) ABSTRACT

A group-III nitride stacked body includes a substrate, an n-type first AlGaN layer expressed by the composition formula $Al_XGa_{1-X}N$ ($0<X\leq1$), and a second AlGaN layer which is disposed between the substrate and the n-type first AlGaN layer and which is expressed by the composition formula $Al_YGa_{1-Y}N$ ($0.5<Y\leq1$, where $Y<X$). A group-III nitride light-emitting element comprises an active layer which is disposed on the n-type first AlGaN layer of the group-III nitride stacked body and which includes at least one well layer. The well layer of the active layer is an AlGaN layer expressed by the composition formula $Al_WGa_{1-W}N$ ($0<W<1$), where the Al composition W is such that $W\leq Y$.

14 Claims, 3 Drawing Sheets

(51) Int. Cl.
    *H01L 33/00*        (2010.01)
    *H01L 33/06*        (2010.01)

(56) References Cited

U.S. PATENT DOCUMENTS

| | | |
|---|---|---|
| 2016/0005919 A1 | 1/2016 | Obata |
| 2016/0172534 A1* | 6/2016 | Iwata .................. H01L 33/12 257/13 |
| 2017/0069793 A1 | 3/2017 | Saito |

FOREIGN PATENT DOCUMENTS

| | | |
|---|---|---|
| WO | 200605673 A1 | 5/2006 |
| WO | 2008078672 A1 | 7/2008 |
| WO | 2014123092 A1 | 8/2014 |

OTHER PUBLICATIONS

PCT/JP2017/016578, International Search Report, dated Jun. 2017.
Hirayama et al., "222-282 nm AlGaN and InAlGaN-based deep-UV LEDs fabricated on high-quality AIN on sapphire," Phys. Status Solidi A 206, No. 6, 1176-82 (2009).
English Abstract of WO 2008078672 A1, Jul. 3, 2008.
English Abstract of WO 2014123092 A1, Aug. 14, 2014.
English Abstract of JP 2008160025 A, Jul. 10, 2008.
English Abstract of JP 2017050439 A, Mar. 9, 2017.
Extended European Search Report, dated Nov. 7, 2019.

\* cited by examiner

GROUP-III NITRIDE STACKED BODY AND GROUP-III NITRIDE LIGHT-EMITTING ELEMENT

This application is a U.S. national stage application of PCT/JP2017/016578 filed on Apr. 26, 2017 and claims priority to Japanese patent document 2016-089487 filed on Apr. 27, 2016, the entireties of which are incorporated herein by reference.

TECHNICAL FIELD

The present invention relates to a novel group III nitride laminate and a novel group III nitride light emitting device using the laminate.

BACKGROUND OF THE INVENTION

A gaseous light source such as heavy hydrogen, mercury, and the like are used as a deep ultraviolet light source having a light emitting wavelength of 365 nm or less. Problems of such gaseous light source are that it has short lifetime and a size of the device is large. Also, mercury is restricted from using in some cases. Therefore, a light emitting device which can solve such problems and also using a semiconductor which can be easily handled is expected.

As such deep ultraviolet light emitting device, the light emitting device using a group III nitride semiconductor represented by a compositional formula of $Al_qGa_{1-q}N$ ($0 \le q \le 1$) is proposed. Such group III nitride semiconductor functions as the deep ultraviolet light emitting device because it is a direct bandgap type semiconductor in entire range of wavelength 200 to 365 nm (Patent Document 1 and Non-Patent Document 1).

The deep ultraviolet light emitting device using the group III nitride semiconductor device is produced in general by carrying out the crystal growth of a laminate structure made of a n-type layer, an active layer, and a p-type layer on a substrate made of single crystal. As a method of crystal growth of the semiconductor laminate structure, for example Metalorganic Chemical Vapor Deposition (MOCVD) method and Molecular Beam Epitaxy (MBE) method may be mentioned.

As the single crystal substrate used for the above crystal growth method, a foreign substrate material such as sapphire, SiC, Si, and the like, and a same substrate such as AlN, GaN, and the like are used. By carrying out the crystal growth of the semiconductor laminate structure which becomes the light emitting device on the substrate, the deep ultraviolet light emitting device using the group III nitride semiconductor is formed.

REFERENCES

Patent Document

Patent Document 1: WO2014/123092

Non-Patent Document

Non-Patent Document 1: Hideki Hirayama, Sachie Fujikawa, Norimichi Noguchi, Jun Norimatsu, Takayoshi Takano, Kenji Tsubaki, and Norihiko Kamata, "222-282 nm AlGaN and InAlGaN-based deep-UV LEDs fabricated on high-quality AlN on sapphire",Phys. Status Solidi A 206, No. 6, 1176-1182 (2009)

However, problems of the light emitting device using the group III nitride semiconductor are that it has a lower luminous efficiency and a weaker optical output than a heavy hydrogen gas lamp and a mercury gas lamp.

As one of the causes of these, a dislocation in the deep ultraviolet light emitting device may be mentioned. In case a foreign substrate material such as sapphire, SiC, and the like is used as the single crystal substrate and the crystal growth of an $Al_qGa_{1-q}N$ layer is carried out on the substrate, because a lattice constant and a thermal expansion coefficient are different from those of the substrate, many dislocations are included during the crystal growth. Hence, the optical output decreases.

Then, in Non-Patent Document 1, the crystal growth method of the $Al_qGa_{1-q}N$ layer is examined, and a dislocation density in the $Al_qGa_{1-q}N$ layer was decreased. As a result, the luminous efficiency is improved, and the optical output is improved (Non-Patent Document 1).

Also, it is known that by carrying out the crystal growth of the $Al_qGa_{1-q}N$ layer using the same substrate as the single crystal substrate, the light emitting device almost free of dislocation can be produced, and the optical output is improved.

Thus, the present inventors have carried out further examination, and attained further improved optical output by incorporating a novel structure to the semiconductor laminate structure of the light emitting device on the AlN substrate (Patent Document 1).

However, when the present inventors continuously produced the light emitting device using the group III nitride semiconductor, the optical output varied between lots, and it was difficult to stably produce the light emitting device having a high optical output.

Therefore, the object of the present invention is to solve the above problem, and to provide the group III nitride laminate and the group III nitride light emitting device using the laminate which enables to stably obtain a high optical output.

SUMMARY OF INVENTION

The present inventors have carried out keen examination to attain the above object. First, a composition and a thickness of each layer constituting the group III nitride semiconductor were examined, and they have found that when an AlGaN layer is provided between a substrate and a n-type AlGaN layer, depending on the composition and the thickness of a plurality of AlGaN layers, the optical output varied differently in the same lot or between lots. Thus, the AlGaN layer provided between the substrate and the n-type AlGaN layer was further examined, and was found that by decreasing Al composition of the AlGaN layer than the Al composition of the n-type AlGaN layer and by making the thickness of the AlGaN layer thinner than the thickness of the n-type AlGaN layer, the light emitting device having less varying optical output and high optical output characteristic can be stably produced. Thereby, the present invention was attained.

That is, the first aspect of the present invention is a group III nitride laminate comprising a substrate and a n-type first AlGaN layer represented by a compositional formula of $Al_XGa_{1-X}N$ ($0 < X \le 1$), wherein a second AlGaN layer represented by a compositional formula of $Al_YGa_{1-Y}N$ ($0.5 < Y \le 1$, note that $Y < X$) is formed between the substrate and the n-type first AlGaN layer, and a thickness tx of the n-type first AlGaN layer and a thickness ty of the second AlGaN layer satisfies tx>ty.

The group III nitride laminate of the present invention may suitably have below embodiments.

(1) A surface layer part expressed by a compositional formula $Al_ZGa_{1-Z}N$ (0.9<Z≤1) is provided at an uppermost surface where the substrate contacts the second AlGaN layer.

(2) The thickness ty of the second AlGaN layer is 30 to 100 nm.

(3) The thickness ratio tx/ty of the n-type first AlGaN layer and the second AlGaN layer is 2 or more and 100 or less.

(4) The second AlGaN layer has the n-type conductivity.

(5) The substrate is an AlN single crystal substrate.

Further, the second aspect of the present invention is a group III nitride light emitting device comprising an active layer having at least one well layer on the n-type AlGaN layer of the group III nitride laminate according to any one of claims 1 to 6, wherein the well layer in the active layer is an AlGaN layer represented by a compositional formula of $Al_WGa_{1-W}N$ (0<W<1), and a composition of Al shown by W is W≤Y.

The group III nitride light emitting device according to second aspect of the present invention preferably has a light emitting peak wavelength of 210 to 365 nm.

The group III nitride laminate of the present invention has an AlGaN layer (second AlGaN layer) between the substrate and the n-type AlGaN layer (first AlGaN layer), wherein the AlGaN layer (second AlGaN layer) has a lower Al composition than the first AlGaN layer and is thinner than the first AlGaN layer. By forming a laminate in such constitution, even in case the substrate and the n-type first AlGaN layer have different composition, a high quality group III nitride laminate can be stably obtained. Thus, by using the group III nitride laminate of the present invention, a group III nitride light emitting device having the optical output with small variation, and having a high optical output characteristic can be obtained.

Note that, in case the substrate and the n-type AlGaN layer have different lattice constants, defects such as a crack and the like may occur during the crystal growth. Thus, Patent Document 1 disclose the group III nitride light emitting device having a plurality of n-type layers on the substrate as an example in order to relieve a lattice mismatch and a roughening of interface between the substrate and the growth layer. Further, Patent Document 1 discloses that when the substrate is a sapphire substrate or AlN substrate, among the plurality of n-type layers, a n-type foundation layer contacting the substrate has a larger bandgap layer than a bandgap of a n-type clad layer laminated on the n-type foundation layer. That is, the Al composition of the n-type foundation layer is higher than that of the n-type clad layer, and Patent Document 1 discloses to laminate in increasing order of the lattice constant (FIG. 8, FIG. 9(A), and [0078] to [0081] of Patent Document 1).

As such, in case of laminating the plurality of AlGaN layers having different Al composition on the substrate of AlN and the like, in general, the Al composition of the AlGaN layer contacting the substrate is made higher in order to suppress the defects such as a crack and the like during the crystal growth.

On the contrary to the constitution of Patent Document 1, in the present invention, a layer having a larger lattice constant and a lower Al composition than the n-type AlGaN layer is introduced as the second AlGaN layer between the substrate and the n-type first AlGaN layer. Further, by making the second AlGaN layer thinner than the n-type AlGaN layer, the defects such as a crack and the like and a light absorption can be suppressed, thereby a high quality group III nitride laminate can be stably obtained. This was firstly found by the present inventors.

DETAILED DESCRIPTION OF INVENTION (Group III Nitride Laminate)

Figure 1:
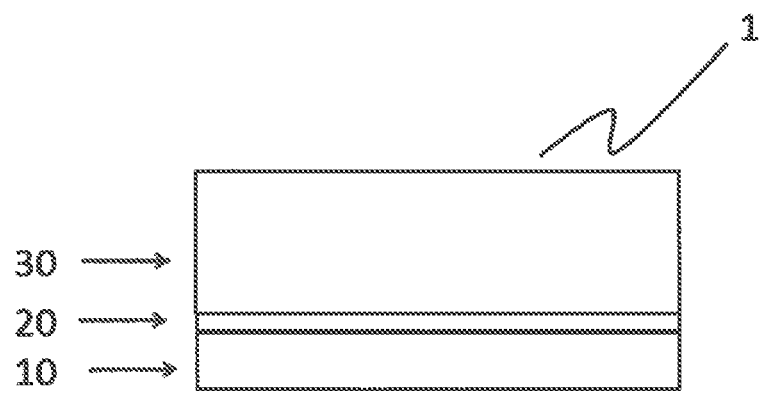
FIG. 1 is a schematic cross section showing an example of a group III nitride laminate of the present invention.

First, a group III nitride laminate of the present invention is explained in below. FIG. 1 is a schematic cross section of a group III nitride laminate 1 of the present invention. The group III nitride laminate 1 includes a n-type first AlGaN layer 30 on a substrate 10, and a second AlGaN layer 20 provided between the substrate 10 and the first AlGaN layer 30.

In the present invention, the n-type first AlGaN layer 30 represented by a compositional formula of $Al_XGa_{1-X}N$ (0<X≤1) and the second AlGaN layer 20 represented by a compositional formula of $Al_YGa_{1-Y}N$ (0.5<Y≤1) satisfy the following.

(1) Al composition X and Al composition Y satisfy Y<X.

(2) When a thickness of the n-type first AlGaN layer 30 is tx and a thickness of the second AlGaN layer 20 is ty, then tx>ty is satisfied.

As such, by using the AlGaN layer (second AlGaN layer) having specific Al composition and thickness, the high quality group III nitride laminate can be stably obtained which can suppress the cracks and a light absorption.

From the point of productivity, preferably the ratio tx/ty between the thickness of the first AlGaN layer 30 and the thickness of the second AlGaN layer 20 is 2 or more and 100 or less.

Next, each layer constituting the group III nitride laminate 1 of the present invention is explained in detail.

(Substrate 10)

The substrate 10 of the group III nitride laminate of the present invention is not particularly limited as long as it is a substrate used for a semiconductor or a light emitting device, and various substrates can be used. Specifically, AlN substrate, GaN substrate, sapphire substrate, SiC substrate, Si substrate, and the like may be mentioned. Among these, the AlN substrate using a C-plane as a growth plane is preferable because it is the same substrate as the second AlGaN layer having a high lattice match, and is transparent to the light having a wavelength of 210 to 365 nm. Also, the sapphire substrate is preferable from the point of transparency to the light having the wavelength of 210 to 365 nm.

Figure 2:
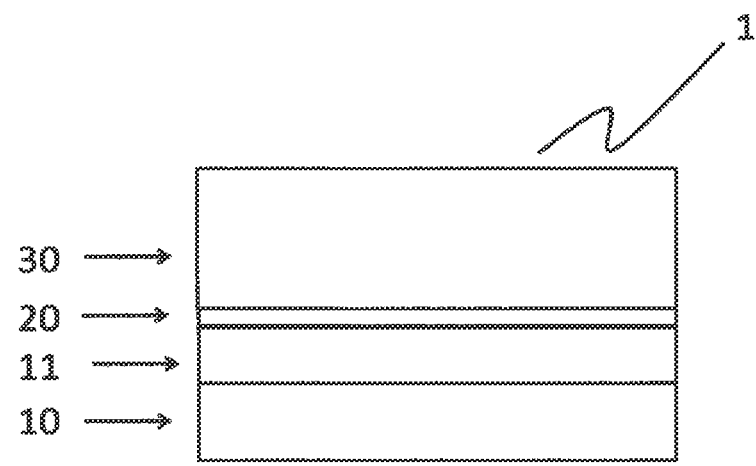
FIG. 2 is a schematic cross section showing other example of the group III nitride laminate of the present invention.

Particularly, from the point of the lattice match, at the uppermost surface of the substrate where the second AlGaN layer contacts, the AlGaN layer represented by a compositional formula of $Al_ZGa_{1-Z}N$ (0.9<Z≤1) is preferably provided. Particularly, when the different substrate is used as the substrate 10, by having the layer represented by a compositional formula of $Al_ZGa_{1-Z}N$ at the uppermost surface (hereinafter, this may be referred as a surface layer part), the second AlGaN layer 20 and the n-type first AlGaN layer 30 can attain high crystallinity, hence it is preferable. FIG. 2 is a schematic cross section of the group III nitride laminate when the substrate 11 has the surface layer part 11. In FIG. 2, the surface layer part 11 represented by a compositional formula of $Al_ZGa_{1-Z}N$ (0.9<Z≤1) is provided between the substrate 10 and the second AlGaN layer 20.

The surface layer part 11 is a single crystal layer which may be a n-type or an undoped layer. In case the surface layer part 11 is the n-type, a dopant material and a concentration of dopant material may be determined depending on the desired purpose, however from the point of stably and efficiently obtaining the n-type surface layer part 11, preferably Si is used as the dopant so that an impurity concentration is within the range of $1\times10^{16}$ to $1\times10^{21}$ [cm$^3$].

From the point of the productivity of the group III nitride light emitting device which will be discussed in below and from the point of obtaining the light emitting device of deep ultraviolet (210 to 365 nm), the Al composition (Z) of the surface layer part 11 is preferably more than 0.90 and 1.00 or less, more preferably 0.92 to 1.00, and even more preferably 0.95 to 1.00.

Also, the thickness of the surface layer part 11 is not particularly limited, and considering the entire thickness of the group III nitride light emitting device, it may be determined accordingly within the range of 1 nm or more and 50 μm or less.

The thickness of the substrate 10 may be determined accordingly considering the entire thickness of the group III nitride light emitting device which is discussed in below. Note that, when the substrate 10 has the surface layer part 11, the total thickness of the substrate 10 and the surface layer part 11 may be within the above range.

(N-type First AlGaN Layer 30)

The n-type first AlGaN layer 30 is represented by a compositional formula of $Al_XGa_{1-X}N$, and it is a single crystal layer doped with a n-type dopant. The dopant material and the concentration of the dopant material may be determined accordingly depending on the desired purpose, and from the point of stably and efficiently obtaining the n-type first AlGaN layer 30, preferably Si is used as the dopant so that an impurity concentration is within the range of $1\times10^{16}$ to $1\times10^{21}$ [cm$^3$].

From the point of the productivity of the group III nitride light emitting device and from the point of obtaining the light emitting device of deep ultraviolet ray (210 to 365 nm), the Al composition (X) of the n-type first AlGaN layer 30 is preferably 0.05 to 0.99, more preferably 0.10 to 0.98, and even more preferably 0.45 to 0.93. Note that, the Al composition (Y) of the second AlGaN layer which is discussed in below and the Al composition (X) of the n-type first AlGaN layer needs to satisfy Y<X, hence the lower limit of X is preferably more than 0.5, and more preferably 0.52 or larger, and even more preferably 0.54 or larger.

The thickness tx of the n-type first AlGaN layer 30 is not particularly limited, as long as tx>ty is satisfied between the thickness ty of the second AlGaN layer 20, the thickness tx may be determined accordingly considering the entire thickness of the group III nitride light emitting device. Specifically, the thickness tx of the first AlGaN layer 30 may be determined within the range of 60 nm to 50 μm.

FIG. 1 shows an example of the n-type first AlGaN layer 30 of a single layer, but the n-type first AlGaN layer 30 may be a plurality of layers having different compositions. Note that, in case the n-type first AlGaN layer 30 is made of plurality of layers, the Al composition of each layer may be determined within the range of 0<X≤1, and particularly satisfies the preferable range mentioned in above.

In case the group III nitride light emitting device is produced using the group III nitride laminate of the present invention having the plurality of n-type layers, by applying a magnetic field to the light emitting device, a n-type hole block layer can be formed which is provided to suppress part of hole introduced from a p-type layer to an active layer from leaking to the n-type layer side, a n-type current diffusion layer can be formed to enhance the conductivity in bilateral direction.

When these n-type layers are plurality of layers, the thickness of each functional layer is preferably 1 nm or more and 50 μm or less.

(Second AlGaN Layer 20)

The second AlGaN layer 20 of the group III nitride laminate of the present invention is represented by a compositional formula of $Al_YGa_{1-Y}N$, and it is a single crystal layer which may be a n-type layer or an undoped layer. In case the second AlGaN layer 20 is the n-type, a dopant material and a concentration of dopant material may be determined depending on the desired purpose, however from the point of stably and efficiently obtaining the n-type first AlGaN layer 30, preferably Si is used as the dopant so that an impurity concentration is within the range of $1\times10^{16}$ to $1\times10^{21}$ [cm$^{-3}$].

The Al composition Y of this second AlGaN layer 20 is within the range of 0.5<Y≤1, and Y<X is satisfied. The ratio (Y/X) between the Al composition (Y) of the second AlGaN layer 20 and the Al composition (X) of the first AlGaN layer 30 is preferably 0.7≤(Y/X)<1.0, more preferably 0.83≤(Y/X)<1.0, and even more preferably 0.87≤(Y/X)<1.0. Also, the second AlGaN layer 20 may include In.

In case the substrate has the surface layer part 11, a compositional difference (Z−Y) between the Al composition (Z) of the surface layer part and the Al composition (Y) of the second AlGaN is 0.39≤(Z−Y)<1, more preferably 0.42≤(Z−Y)<1, and even more preferably 0.5≤(Z−Y)<1.

Also, the thickness ty of the second AlGaN layer 20 is not particularly limited as long as it satisfies tx>ty with respect to the thickness tx of the n-type first AlGaN layer 30; and it may be determined accordingly considering the thickness tx of the n-type first AlGaN layer 30 and the entire thickness of the group III nitride light emitting device which is discussed in below. From the point of the productivity, the ratio tx/ty is preferably 2 or more and 100 or less, and more preferably within the range of 3 to 70. Specifically, the thickness ty of the second AlGaN layer 20 may be determined accordingly within the range of 3 nm or more and 100 nm or less.

(Method of Producing Group III Nitride Laminate 1)

The group III nitride laminate 1 of the present invention can be produced by a known production method such as Metalogranic Chemical Vapor Deposition method (MOCVD method). Specifically, in FIG. 1 and FIG. 2, using a commercially available device, a source material gas such as a group III raw material gas for example organometallic gas such as trimethyl aluminum, trimethyl gallium, and the like, nitrogen source gas such as ammonium gas are supplied on the substrate 10, thereby the surface layer part 11 is laminated on the substrate 10 if needed, then the second AlGaN layer 20 and the first AlGaN layer 30 are laminated in this order, thereby the group III nitride laminate 1 can be produced. Also, the group III nitride laminate of the present invention can be produced by a method other than MOCVD method.

Note that, as the condition of producing the group III nitride laminate of the present invention by MOCVD method, a known method can be employed, and in order to maintain a flatness of the second AlGaN layer 20 and to laminate with good control, it is preferable to carry out the crystal growth at higher V/III ratio and slower crystal growth rate than a known method. Specifically, the crystal growth is preferably carried out under V/III ratio of 3500 or more and the growth rate of 200 nm/h or less, more preferably V/III ratio of 5000 or more and the growth rate of 150 nm/h or less.

The ratio of constituting device (Al, Ga, and N) in each layer constituting the group III nitride laminate of the present invention can be obtained by measuring the produced nitride semiconductor light emitting device using X ray diffraction (XRD) method, SIMS (Secondary Ion-microprobe Mass Spectometer), TEM-EDX (Transmission Electron Microscope-Energy Dispersive X-ray spectrometry), 3 Dimensional Atom Probe (3DAP) method, and the like. Also, the ratio of the constituting device of each layer can be converted from a bandgap. By analyzing the nitride semiconductor light emitting device using Cathode Luminescence method (CL method) and Photoluminescence method (PL method), the bandgap of each layer can be obtained directly, hence the Al composition can be determined using a conversion equation.

Next, the group III nitride light emitting device using the group III nitride laminate of the present invention is described.

(Group III Nitride Light Emitting Device 100)

First, a basic summary of the group III nitride light emitting device 100 is described.

In the present invention, the group III nitride light emitting device (also referred as the deep ultraviolet light emitting device) having a light emitting wavelength of 210 to 365 nm can be produced for example by Metalorganic Chemical Vapor Deposition method (MOCVD method). Specifically, using a commercially available device, a source material gas such as a group III raw material gas, for example organometallic gas such as trimethyl aluminum, trimethyl gallium, and the like and a nitrogen source gas such as ammonia gas are supplied on the substrate 10, thereby the group III nitride laminate, the active layer, and the p-type layer can be formed by crystal growth in this order. Thereby, the group III nitride light emitting device can be produced. As the condition of producing the nitride semiconductor light emitting device by MOCVD method, a known method can be employed. Also, the group III nitride laminate of the present invention can be produced by a method other than MOCVD method.

In the present invention, the group III nitride light emitting device is not particularly limited as long as it has a wavelength of 210 to 365 nm. Specifically, the group III nitride light emitting device includes aluminum (Al), gallium (Ga), and nitrogen (N) and composition of each layer is determined, and has a wavelength of 210 to 365 nm.

The ratio of constituting element (Al, Ga, and N) can be measured by various analysis methods mentioned in above, and in examples and comparative examples of the present application, the Al composition of each layer was obtained by X-ray Diffraction (XRD) method.

Figure 3:
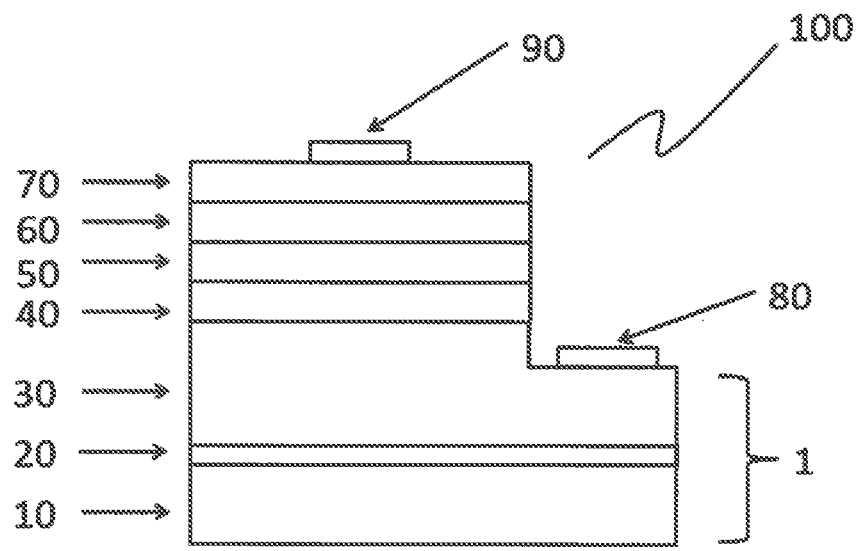
FIG. 3 is a schematic cross section showing an example of a group III nitride light emitting device (deep ultraviolet light emitting device) of the present invention.
Figure 4:
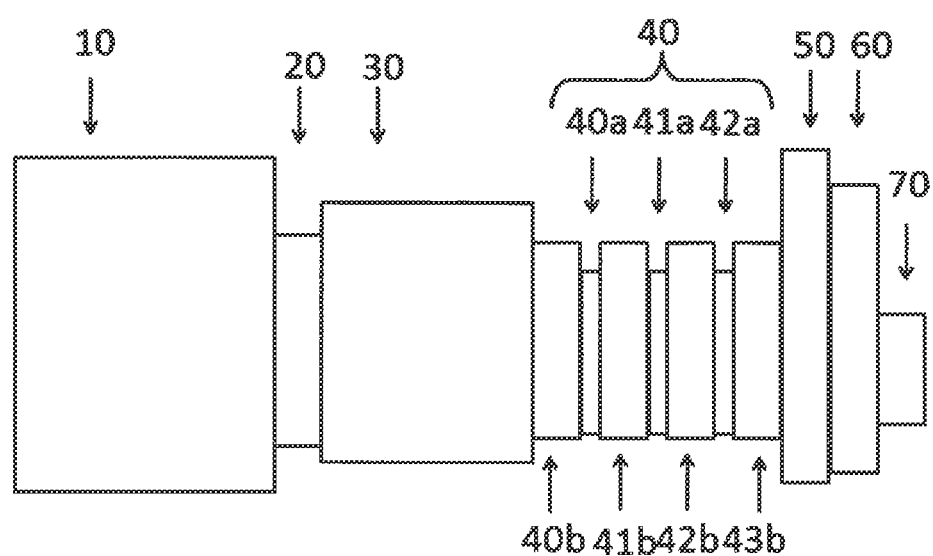
FIG. 4 is an example of energy-band of the group III nitride light emitting device shown in FIG. 3.
Figure 5:
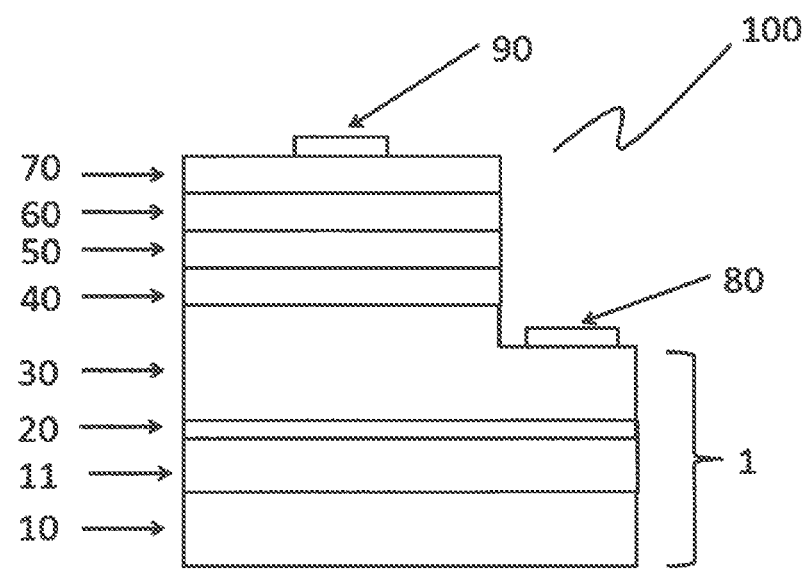
FIG. 5 is a schematic cross section showing other example of the group III nitride light emitting device of the present invention.
Figure 6:
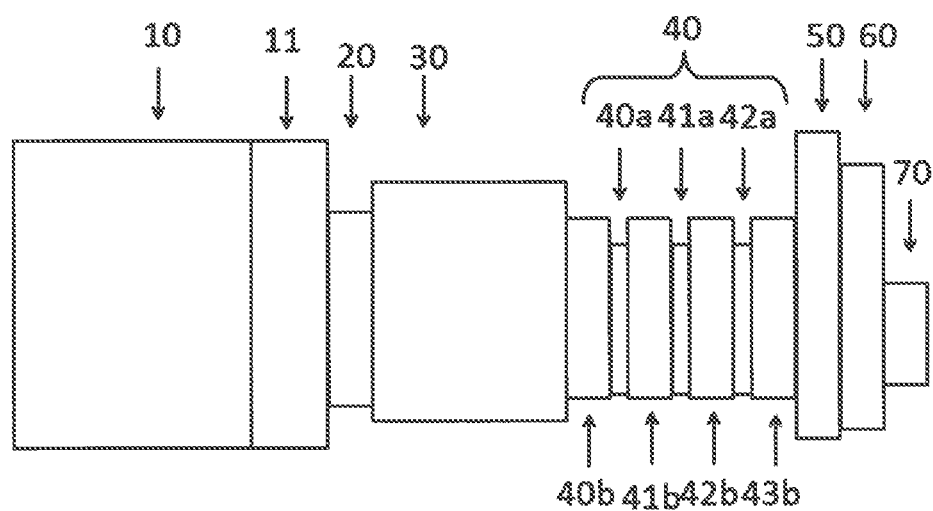
FIG. 6 is an example of energy-band of the group III nitride light emitting device shown in FIG. 3.

Hereinafter, the group III nitride light emitting device of the present invention is described in detail using figures. FIG. 3 is a schematic cross section of the typical group III nitride light emitting device 100 using the group III nitride laminate 1 of FIG. 1. Also, FIG. 4 shows an example of an energy-band of the group III nitride light emitting device of FIG. 3. In FIG. 4, a distance between the solid lines in a vertical direction of the figure shows the degree of bandgap. The solid line of an upper direction in the figure shows the energy level of a conduction band, and the solid line of a lower direction shows the energy level of a valence band. In AlGaN based semiconductor, as the Al composition increases, the bandgap becomes larger, and the space between a vertical direction corresponds to the Al composition of each AlGaN layer; and as the space becomes wider, it indicates that the AlGaN layer has high Al composition (same applies to other energy-band figure). Also, FIG. 5 shows a schematic cross section of the typical group III nitride light emitting device using the group III nitride laminate of FIG. 2. Also, FIG. 6 shows an example of energy-band of the group III nitride light emitting device of FIG. 5.

The group III nitride light emitting device 100 includes an active layer 40 provided on the n-type first AlGaN layer of the group III nitride laminate 1, an electron block layer 50 provided on the active layer 40, a p-type clad layer provided on the electron block layer 50, and a p-type contact layer 70 provided on the p-type clad layer. Note that, the active layer 40 has at least one well layer. Also, as it is described in below, the group III nitride light emitting device of the present invention may have a laminate structure without the electron block layer 50.

In addition, usually, the group III nitride light emitting device 100 has a p-type electrode 90 on the p-type contact layer 70, and a n-type electrode 80 provided on the first AlGaN layer 30 exposed by etching from the p-type contact layer 70 to part of the n-type first AlGaN layer 30. The p-type electrode 90 and the n-type electrode 80 can be formed by a known method. Also, in this FIG. 11, the n-type first AlGaN layer 30 is a single layer (a single layer made of same composition), but it may be formed by a plurality of layers having different composition.

Next, each layer is described in detail.

(Active Layer 40)

The active layer 40 is formed on the n-type first AlGaN layer 30. The active layer 40 has at least one well layer. The numbers of well layers (well number) are three in FIG. 4, but it may be one or two or more. In case the active layer has a plurality of well layers, a barrier layer which is discussed in below is preferably provided between each well layer. The numbers of well layers are not particularly limited, and considering the productivity of the group III nitride light emitting device, it is preferably 10 or less. In FIG. 4, the well layers 40a, 41a, and 42a are shown, and the barrier layers 40b, 41b, and 43b are shown.

(Barrier Layer)

There is two pattern of active layer, that is the active layer made of the barrier layer and the well layer, and the active layer made only of the well layer. In case the barrier layer is present, the barrier layer usually has larger bandgap than the well layer. Therefore, the barrier layer is formed by AlGaN having higher Al composition than the well layer.

In the deep ultraviolet light emitting device, the barrier layer is formed by a single crystal represented by a compositional formula of $Al_VGa_{1-V}N$ (0.02≤V≤0.99).

Note that when plurality of barrier layers exist, each layer may have different thickness and composition as long as the thickness is within the range of 0.5 to 50 nm and satisfies the above compositional formula (0.02≤V≤0.99); however considering the productivity, preferably each layer has the same thickness and composition. Note that, the thickness of the barrier layer is more preferably 2 to 20 nm, and even more preferably it is 3 to 10 nm. When the composition of each layer differs, the Al composition ratio of the barrier layer with highest Al composition ratio is used in case the layer is compared with Al composition ratio of other layer.

(Well Layer)

The well layer is the layer where carrier rebinds and illuminates. Therefore, the well layer is formed by an AlGaN single crystal having lowest Al composition besides the p-type contact layer.

When the well layer is a single crystal represented by a compositional formula of $Al_wGa_{1-w}N$, the Al composition (W) of the well layer may be determined according to the balance between other layers, and preferably it satisfies $0 \leq W \leq 0.97$, more preferably $0.10 \leq W \leq 0.97$, and particularly preferably $0.30 \leq W \leq 0.92$.

Also, the thickness of the well layer may be 1.5 nm or more and 20 nm or less.

In case a plurality of well layers are present, each layer has a thickness within the range of 1.5 nm or more and 20 nm or less and the compositional formula within the range of ($0 \leq W \leq 0.97$); and preferably each layer has same thickness and composition.

(Structure of Active Layer 40)

The active layer 40 has a structure of which the well layer and the barrier layer are laminated (multilayer structure), or it may be a single structure only made of the well layer.

In case of the single structure only made of the well layer, the well layer contacts with the first AlGaN layer 30 and the electron block layer 50. Note that, as it is described in below, the electron block layer 50 is not necessarily needed. In case the electron block layer 50 is not present, the well layer may contact with the p-type clad layer 60.

Also, in case of the multilayer structure, as shown in FIG. 4, the layer contacting the n-type first AlGaN layer 30 can be a barrier layer 40b, and the layer contacting with the electron block layer 50 can be a barrier layer 43b. By having such structure, the dopant can be prevented from dispersing to the well layer from the n-type layer and the p-type layer. Note that, FIG. 4 shows an example of which the barrier layer 43b contacts the electron block layer 50, but if the electron block layer 50 is not present, then the barrier layer 43b may contact with the p-type clad layer 60.

Also, the layer contacting with the n-type first AlGaN layer 30 can be the well layer 40a, and the layer contacting the electron block layer 50 can be the well layer 42a. By taking such constitution, the electron block layer 50 contacting with the well layer 42a becomes the barrier layer; hence the carrier overflow can be suppressed. Further, in case the electron block layer 50 is not present, the well layer 42a may contact with the p-type clad layer 60.

Also, the layer contacting with the n-type first AlGaN layer 30 can be the barrier layer 40b, and the layer contacting with the electron block layer 50 can be the well layer 42a. On the contrary, the layer contacting with the n-type first AlGaN layer 30 can be the well layer 40a, and the layer contacting with the electron block layer 50 can be the barrier layer 43b. By taking such structure, a light field can be regulated, and the semiconductor laser can be easily designed when producing. Note that, in case none of the examples have the electron block layer 50, the well layer 42a and the barrier layer 43b may be in contact with the p-type clad layer 60.

Further, the barrier layers 40b to 43b can be added with the p-type or n-type dopant. In case of adding the p-type dopant, by applying an electrical field, this enhances the effect of suppressing part of electrons which are introduced to the active layer from the n-type layer leaking to the p-type layer side (the suppressing effect of carrier overflow), and also QCSE (Quantum Confined Stark Effect) can be suppressed as well. Also, when adding the n-type dopant, QCSE can be suppressed.

(Electron Block Layer 50)

The electron block layer 50 is a layer provided if needed. The function of this layer is to suppress the carrier overflow. Therefore, the p-type clad layer 60 which is described in below can function as the electron block layer 50, but by providing the electron block layer 50, the Al composition of the p-type clad layer can be lowered and of layer can be thinned. As a result, a driving voltage can be decreased.

In case the electron block layer 50 is provided, the electron block layer 50 preferably has a larger bandgap than that of the layer forming the active layer 40 and the p-type layer which is described in below. Note that, the bandgap of the active layer refers to the bandgap of the barrier layer having maximum Al composition. In other words, the electron block layer 50 is formed from single crystal made of AlGaN having higher Al composition ratio than the active layer 40 and the p-type layer. The electron block layer 50 is preferably formed between the active layer 40 and the p-type clad layer 60 which is described in below. Further, the Al composition of the electron block layer 50 may be lower than the Al composition of the n-type first AlGaN layer 30, but it is preferably formed from AlGaN single crystal having higher Al composition than the first AlGaN layer 30. That is, the electron block layer 50 is preferably formed from the AlGaN single crystal layer having high Al composition than any other layers.

When the electron block layer 50 is represented by a compositional formula of $Al_aGa_{1-a}N$, the Al composition (a) is preferably $0.13 \leq a \leq 1.00$, more preferably $0.33 \leq a \leq 1.00$, and particularly preferably $0.53 \leq a \leq 1.00$.

Also, as mentioned in above, the Al composition (a) of the electron block layer 50 is preferably larger than the Al composition (b) of the p-type clad layer 60.

Also, the electron block layer 50 may be doped with the p-type dopant, or it may be an i-type undoped layer. In case the p-type dopant is doped, for example, in case Mg is doped, preferably an impurity concentration is $1 \times 10^{16}$ to $1 \times 10^{21}$ [cm$^3$]. Further, this electron block layer 50 may have an area doped with the p-type dopant and the area which has not been doped. In this case, an impurity concentration of the electron block layer 50 as a whole is preferably $1 \times 10^{16}$ to $1 \times 10^{21}$ [cm$^3$].

The electron block layer 50 is not particularly limited, and the thickness is preferably 1 nm or more and 50 nm or less. Also, the electron block layer 50 may include In within the range which does not interfere the effect.

(P-type Clad Layer 60)

The p-type clad layer 60 is formed on the electron block layer 50. Note that, in case the electron block layer 50 is not provided, the p-type clad layer 60 is formed on the active layer.

In the present invention, the p-type clad layer 60 is represented by a compositional formula of $Al_bGa_{1-b}N$ ($0.12 < b \leq 1.00$), and to further enhance the effect, an Al composition (b) is preferably $0.32 \leq b \leq 1.00$, and more preferably $0.52 \leq b \leq 1.00$.

The thickness of the p-type clad layer 60 is not particularly limited, and preferably it is 1 nm or more and 1 µm or less. Also, the p-type clad layer 60 may include In within the range which does not interfere the effect.

(P-type Contact Layer 70)

The p-type contact layer 70 is formed on the p-type clad layer 60. By forming the p-type contact layer 70, an ohmic contact between the p-type electrode 90 can be attained easily, and the contact resistance thereof can be easily reduced.

In case of providing the p-type contact layer 70, the bandgap of the p-type contact layer 70 is preferably lower than the bandgap of the p-type clad layer 60. That is, the Al compositional ratio of the p-type contact layer 70 is preferably smaller than the Al composition of the p-type clad layer 60. When the p-type contact layer 70 is constituted by a single crystal represented by a compositional formula of $Al_cGa_{1-c}N$, the Al composition (c) is preferably 0.00 to 0.70, more preferably 0.00 to 0.40, and most preferably the p-type contact layer 70 is formed by a single crystal of GaN (c=0.00). Also, this p-type contact layer 70 may include In within the range which does not interfere the effect.

The thickness of the p-type contact layer 70 is not particularly limited, and preferably it is 1 nm or more and 500 nm or less.

(Wafer)

The present invention also relates to a wafer having the above mentioned laminate structure. In the above, the group III nitride light emitting device has been explained, but the present invention includes a wafer in which plurality of group III nitride light emitting devices exist. That is, the group III nitride wafer having the multilayer structure explained in the above group III nitride light emitting device is included. Usually, each group III nitride light emitting device is used by cutting out from the wafer having the plurality of group III nitride light emitting devices (the laminate structure having the wafer mentioned in above).

EXAMPLE

Hereinafter, the present invention is described in detail using examples and comparative examples; however the present invention is not to be limited thereto.

In the below examples and comparative examples, a ratio of constituting elements of each layer was measured by X-ray Diffraction (XRD) method, and a bandgap was obtained by Photoluminescence (PL) method. For XRD measurement, X'Pert PRO made by PANalytical B.V. was used, and for PL method measurement, HR800 UV made by HORIBA, Ltd. was used. For measuring the light emitting wavelength, SMS-500 made by SphereOptics Gmbh was used, and the wavelength having maximum luminescence intensity was recorded as the light emitting wavelength.

Example 1

The group III nitride light emitting device having the laminate structure shown in FIG. 3 was produced. First, using MOCVD method, $Al_{0.68}Ga_{0.32}N$ layer doped with Si (ty=30 nm and Si concentration of $4\times10^{18}$ cm$^{-3}$) was formed as a second AlGaN layer 20 to a C-plane of AlN substrate 10 having a diameter of 25 mm and a thickness of 600 μm.

Next, as a n-type first AlGaN layer 30, $Al_{0.70}Ga_{0.30}N$ layer doped with Si was formed (tx=1000 nm, Si concentration of $8\times10^{18}$ cm$^3$).

Next, on the n-type AlGaN layer 30, four layers of barrier layers (a composition of $Al_{0.65}Ga_{0.35}N$, Si doped, a thickness of 7 nm, and Si concentration of $1\times10^{18}$ cm$^{-3}$) and three layers of well layers (a composition of $Al_{0.5}Ga_{0.5}N$, undoped, a thickness of 1.8 nm) were formed so that the barrier layer and the well layer are laminated in alternating manner, thereby an active layer 40 having a quantum well structure (see FIG. 4) having three well layers was formed. One of the barrier layer is formed so that it contacts with the n-type first AlGaN layer 30, and one of other barrier layer was formed as the outermost layer.

On the active layer 40 (that is on the barrier layer on the outermost layer of the active layer), an AlN layer doped with Mg (a thickness of 15 nm and Mg concentration of $3\times10^{19}$ cm$^{-3}$) was formed as an electron block layer 50. Further, on the electron block layer 50, $Al_{0.5}Ga_{0.2}N$ layer doped with Mg (a thickness of 50 nm and Mg concentration of $3\times10^{19}$ cm$^{-3}$) was formed as a p-type clad layer 60. Further, GaN layer doped with Mg (a thickness of 270 nm and Mg concentration of $2\times10^{19}$ cm$^{-3}$) was formed as the p-type clad layer.

Next, a heat treatment was carried out in nitrogen atmosphere for 20 minutes at 900° C. Then, to the surface of the p-type contact layer 70, a predetermined pattern of a resist pattern was formed by photolithography, and a window part where the resist pattern is not formed was etched by a reactive ion etching until the n-type first AlGaN layer 30 was exposed. Then, to the surface of the exposed n-type first AlGaN layer 30, Ti (20 nm)/Al (200 nm)/Au (5 nm) electrode (n-type electrode) was formed by a vaccum deposition method, and a heat treatment was carried out in nitrogen atmosphere for 1 minute at 810° C. Next, to the surface of the p-type contact layer 70, Ni (20 nm)/Au (50 nm) electrode (p-type electrode) was formed by a vacuum deposition method, and a heat treatment was carried out in oxygen atmosphere for 3 minutes at 550° C.

Next, the AlN substrate is mechanically polished and thinned, thereby a light emitting diode was made. The thickness of the substrate after polishing was 100 am. The produced light emitting diode wafer was cut into plurality of chips of 800×800 μm by a laser scribing, then it was flip chip bonded on a ceramic mount, thereby the group III nitride light emitting device was made. Five lots of the group III nitride light emitting device were produced by the above method.

The obtained group III nitride light emitting device had an average optical output of 8.1 mW when an injection current was 150 mA, and an average optical output was 13.6 mW when an injection current was 300 mA. When a ratio between a slope efficiency (=optical output/injection current amount: mW/mA) driven at 150 mA and a slope efficiency driven at 300 mA were standardized as a droop amount, an average droop amount was 0.84. Further, a maximum and a minimum optical output of the five lots driven at 150 mA were 11.3 mW and 5.9 mW respectively, and the difference between maximum and minimum was 5.4 mW.

Examples 2 to 3 and Comparative Example 1 to 3

Five lots of nitride semiconductor light emitting devices were produced as same as Example 1, except that Al composition X and the thickness tx of the n-type first AlGaN layer 30 and Al composition Y and the thickness ty of the second AlGaN layer 20 of Example 1 were changed as shown in Table 1. The evaluation results of the obtained group III nitride light emitting device are shown in Table 2. Note that, the evaluation results of Comparative example 3 were unable to measure as the optical output was extremely small. Also, the average light emitting wavelength driven at 150 mA of Examples 1 to 5 and Comparative examples 1 and were 265 nm.

TABLE 1

| | Second AlGaN layer | | n-type first AlGaN layer | | |
|---|---|---|---|---|---|
| | Al composition (Y) | Thickness (ty) nm | Al composition (X) | Thickness (tx) nm | tx/ty |
| Example 1 | 0.68 | 30 | 0.70 | 1000 | 33 |
| Example 2 | 0.68 | 40 | 0.70 | 1000 | 25 |
| Example 3 | 0.63 | 30 | 0.70 | 1000 | 33 |
| Example 4 | 0.68 | 20 | 0.70 | 1000 | 50 |
| Example 5 | 0.68 | 300 | 0.70 | 700 | 2.3 |
| Comparative example 1 | 0.72 | 30 | 0.70 | 1000 | 33 |
| Comparative example 2 | 0.68 | 700 | 0.70 | 300 | 0.43 |
| Comparative example 3 | 0.48 | 15 | 0.70 | 1000 | 67 |

TABLE 2

| | Optical output (mW) | | | Average optical outout (mW) | | Average droop amount |
|---|---|---|---|---|---|---|
| | Max | Min | Difference | Driven at 150 mA | Driven at 300 mA | |
| Example 1 | 11.3 | 5.9 | 5.4 | 8.1 | 13.6 | 0.84 |
| Example 2 | 13.6 | 10.5 | 3.1 | 12.8 | 23.6 | 0.92 |
| Example 3 | 13.4 | 9.8 | 3.6 | 12.6 | 25.0 | 1.01 |
| Example 4 | 10.9 | 5.0 | 5.9 | 7.2 | 12.0 | 0.83 |
| Example 5 | 11.1 | 5.4 | 5.7 | 7.3 | 12.3 | 0.84 |
| Comparative example 1 | 7.3 | 3.5 | 3.8 | 5.3 | 8.9 | 0.84 |
| Comparative example 2 | 10.7 | 4.5 | 6.2 | 6.8 | 11.2 | 0.82 |
| Comparative example 3 | — | — | — | — | — | — |

REFERENCES OF NUMERALS

1: Group III nitride laminate
10: Substrate
11: Surface layer part
20: Second AlGaN layer
30: n-type first AlGaN layer
40: Active layer
40a, 41a, 42a: Well layer
40b, 41b, 42b, 43b: Barrier layer
50: Electron block layer
60: p-type block layer
70: p-type contact layer
80: n-type electrode
90: p-type electrode
100: Group III nitride light emitting device

The invention claimed is:

1. A group III nitride laminate comprising:
a substrate, and
a n-type first AlGaN layer represented by a compositional formula of $Al_XGa_{1-X}N$, wherein $0<X\leq1$,
wherein a single second AlGaN layer represented by a compositional formula of $Al_YGa_{1-Y}N$, wherein $0.5<Y\leq1$, note that Y<X, is formed between the substrate and the n-type first AlGaN layer,
wherein a thickness tx of the n-type first AlGaN layer and a thickness ty of the second AlGaN layer satisfies tx>ty, and
wherein the thickness ty of the second AlGaN layer is 30 to 100 nm.

2. The group III nitride laminate according to claim 1, wherein a surface layer part represented by a compositional formula of $Al_ZGa_{1-Z}N$, wherein $0.9<Z\leq1$, is provided on an uppermost surface of the substrate where the second AlGaN layer contacts.

3. The group III nitride laminate according to claim 1, wherein a thickness ratio tx/ty between the n-type first AlGaN layer and the second AlGaN layer is 2 or larger and 100 or less.

4. The group III nitride laminate according to claim 1, wherein the second AlGaN layer has a n-type conductivity.

5. The group III nitride laminate according to claim 1, wherein the substrate is an AlN single crystal substrate.

6. A group III nitride light emitting device comprising an active layer having at least one well layer on the n-type AlGaN layer of the group III nitride laminate according to claim 1, wherein the well layer in the active layer is an AlGaN layer represented by a compositional formula of $Al_WGa_{1-W}N$, wherein $0\leq W<1$, and a composition of Al shown by W is $W\leq Y$.

7. The group III nitride light emitting device according to claim 6, wherein a light emitting peak wavelength is 210 to 365 nm.

8. A group III nitride laminate, comprising:
a substrate, and
a n-type first AlGaN layer represented by a compositional formula of $Al_XGa_{1-X}N$, wherein $0<X\leq1$,
wherein a second AlGaN layer represented by a compositional formula of $Al_YGa_{1-Y}N$ wherein $0.5<Y\leq1$, note that Y<X, is formed between the substrate and the n-type first AlGaN layer,
wherein a thickness tx of the n-type first AlGaN layer and a thickness ty of the second AlGaN layer satisfies tx>ty; and
wherein the second AlGaN layer is directly contacting on the substrate.

9. The group III nitride laminate according to claim 8, wherein the thickness ty of the second AlGaN layer is 30 to 100 nm.

10. The group III nitride laminate according to claim 8, wherein a thickness ratio tx/ty between the n-type first AlGaN layer and the second AlGaN layer is 2 or larger and 100 or less.

11. The group III nitride laminate according to claim 8, wherein the second AlGaN layer has a n-type conductivity.

12. The group III nitride laminate according to claim 8, wherein the substrate is an AlN single crystal substrate.

13. A group III nitride light emitting device comprising an active layer having at least one well layer on the n-type AlGaN layer of the group III nitride laminate according to claim 8, wherein the well layer in the active layer is an AlGaN layer represented by a compositional formula of $Al_WGa_{1-W}N$, wherein $0\leq W<1$, and a composition of Al shown by W is $W\leq Y$.

14. The group III nitride light emitting device according to claim 13, wherein a light emitting peak wavelength is 210 to 365 nm.

* * * * *